(12) United States Patent
Frazier et al.

(10) Patent No.: US 6,495,905 B2
(45) Date of Patent: Dec. 17, 2002

(54) NANOMECHANICAL SWITCHES AND CIRCUITS

(75) Inventors: Gary A. Frazier, Garland, TX (US); Alan C. Seabaugh, Granger, IN (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/165,698

(22) Filed: Jun. 7, 2002

(65) Prior Publication Data

US 2002/0153584 A1 Oct. 24, 2002

Related U.S. Application Data

(62) Division of application No. 09/711,001, filed on Nov. 9, 2000.

(51) Int. Cl.[7] .......................... H01L 29/70; H01L 27/82
(52) U.S. Cl. ..................... 257/587; 257/423; 257/586
(58) Field of Search ........................... 257/415, 421, 257/423, 586, 587

(56) References Cited

U.S. PATENT DOCUMENTS

| | | |
|---|---|---|
| 5,149,673 A | 9/1992 | McDonald et al. |
| 5,258,591 A | 11/1993 | Buck |
| 5,367,136 A | 11/1994 | Buck |
| 5,395,802 A * | 3/1995 | Kiyota et al. ............... 438/330 |
| 5,397,904 A * | 3/1995 | Arney et al. ................. 257/417 |
| 5,596,194 A | 1/1997 | Kubena et al. |
| 6,202,495 B1 | 3/2001 | Zavracky et al. |
| 6,229,683 B1 | 5/2001 | Goodwin-Johansson |

* cited by examiner

Primary Examiner—Allan R. Wilson
(74) Attorney, Agent, or Firm—J. Dennis Moore; W. James Brady, III; Frederick J. Telecky, Jr.

(57) ABSTRACT

A highly miniaturized nanomechanical transistor switch is fabricated using a mechanical cantilever which creates a conductive path between two electrodes in its deflected state. In one embodiment, the cantilever is deflected by an electrostatic attraction arising from a voltage potential between the cantilever and a control electrode. In another embodiment, the cantilever is formed of a material with high magnetic permeability, and is deflected in response to complementary magnetic fields induced in the cantilever and in an adjacent electrode. The nanomechanical switch can be fabricated using well known semiconductor fabrication techniques, although semiconductor materials are not necessary for fabrication. The switch can rely upon physical contact between the cantilever and the adjacent electrode for current flow, or can rely upon sufficient proximity between the cantilever and the adjacent electrode to allow for tunneling current flow.

10 Claims, 12 Drawing Sheets

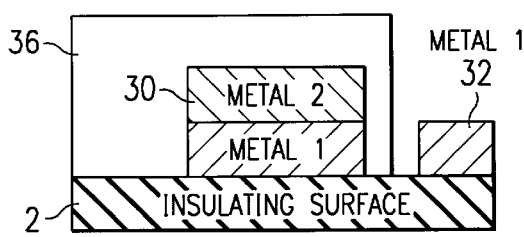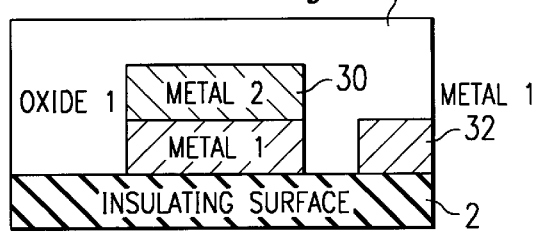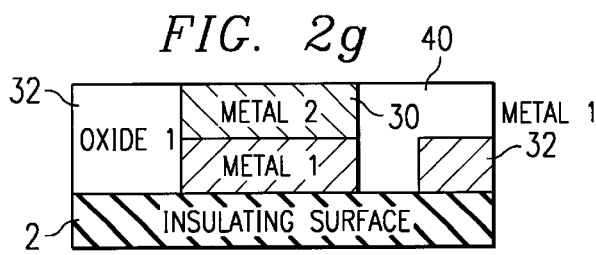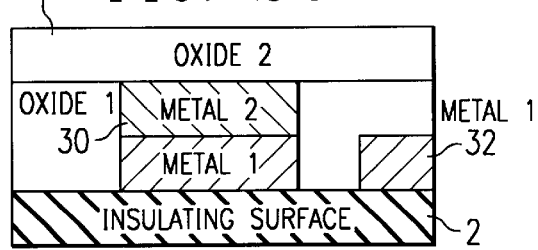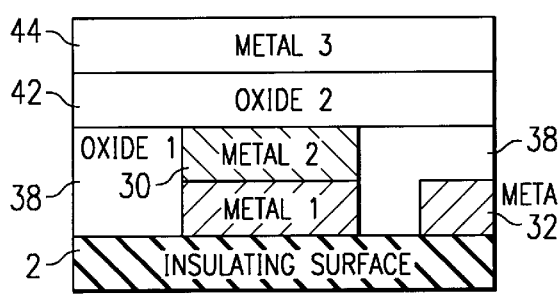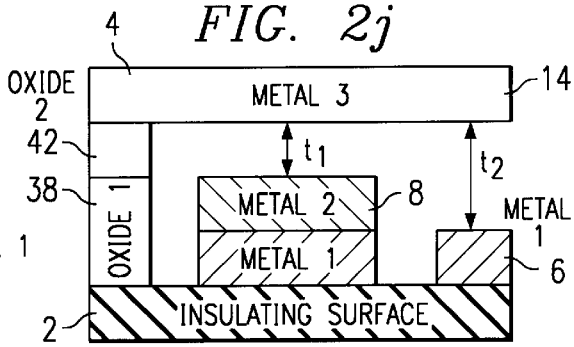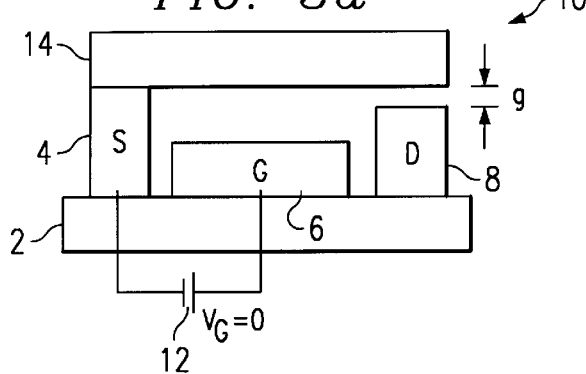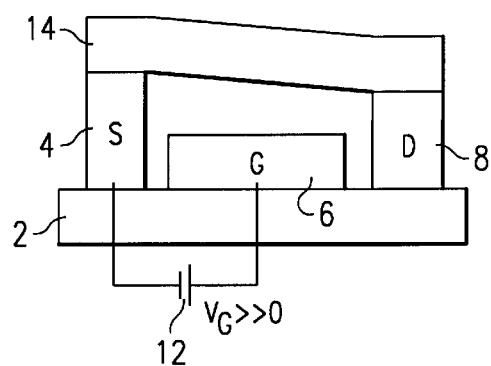

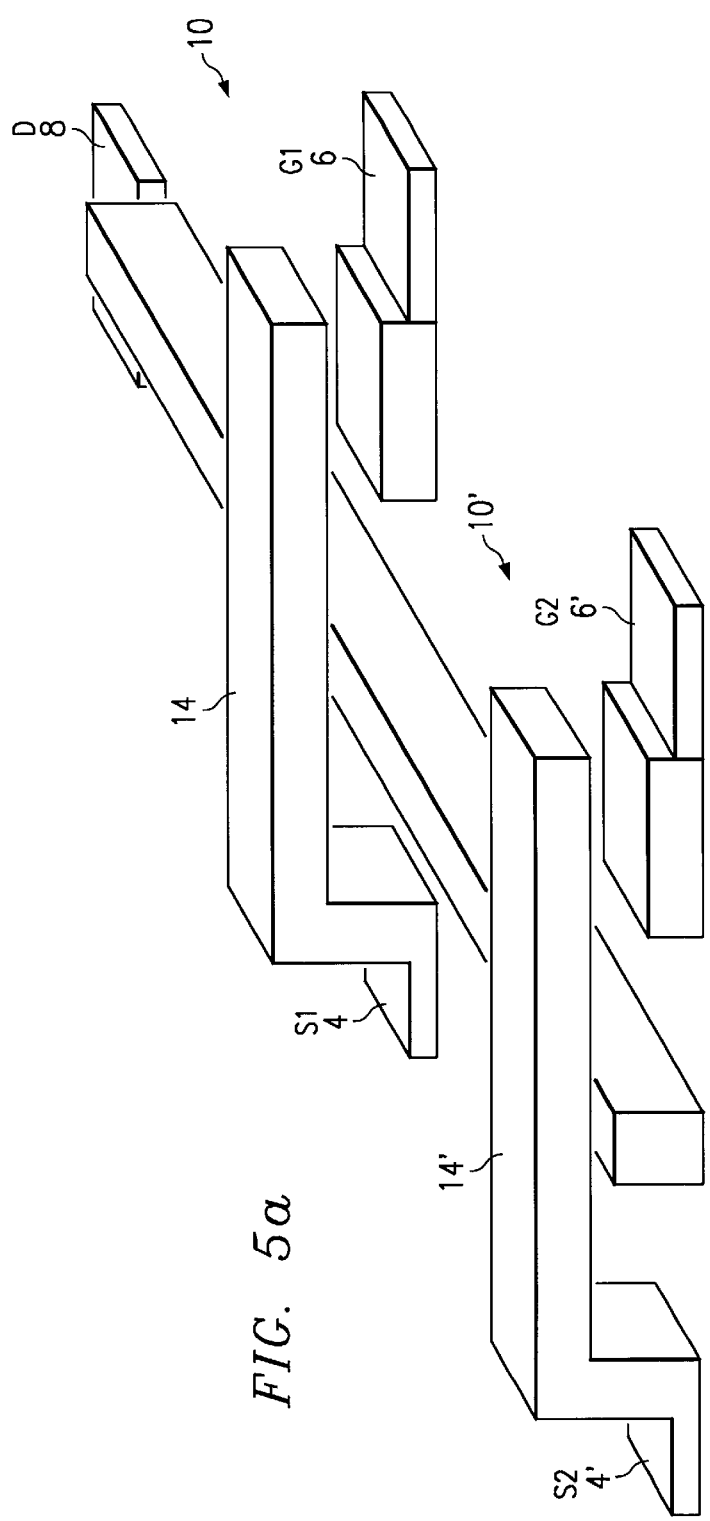
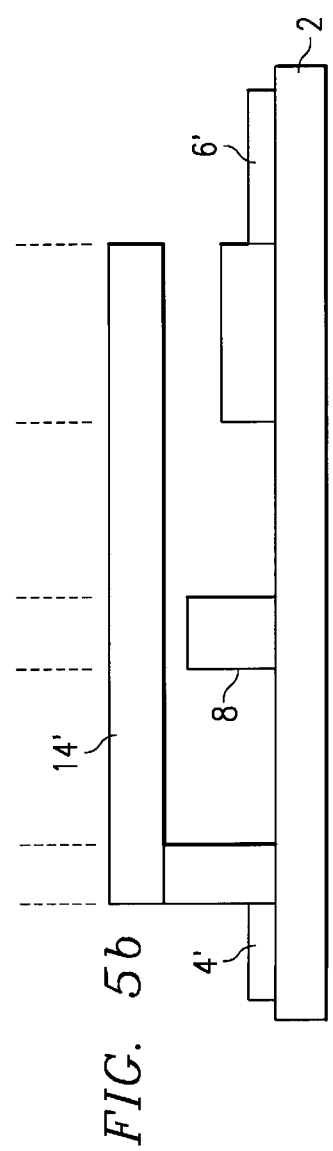
FIG. 5a
FIG. 5b

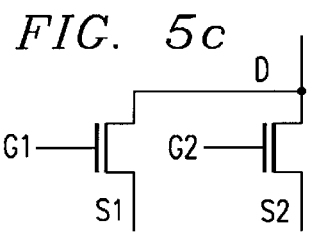
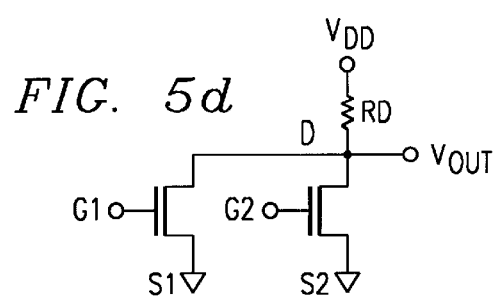
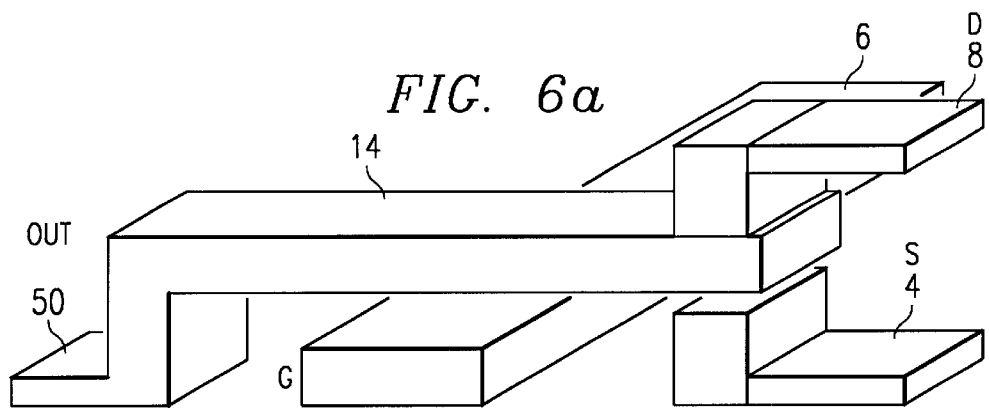
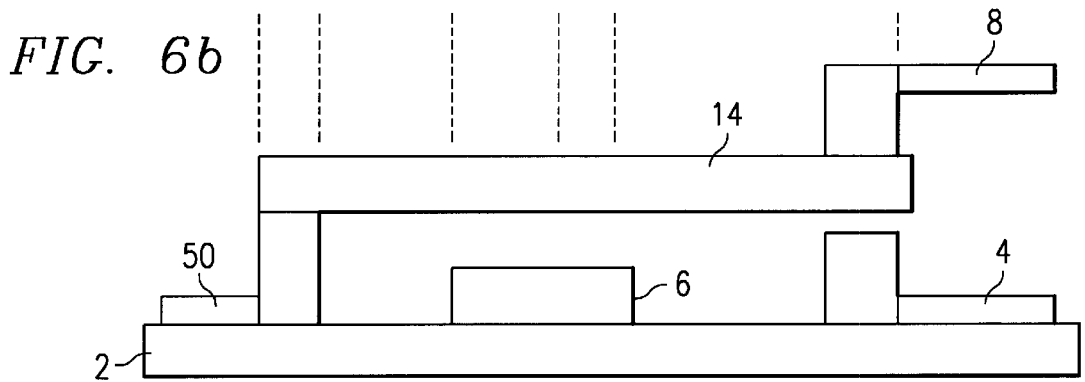
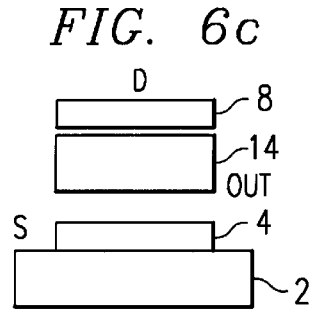
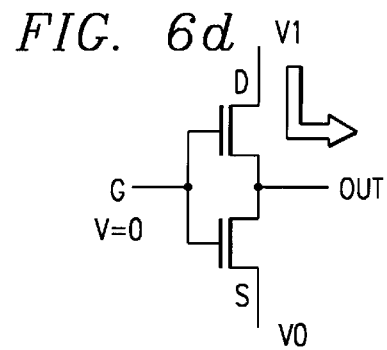

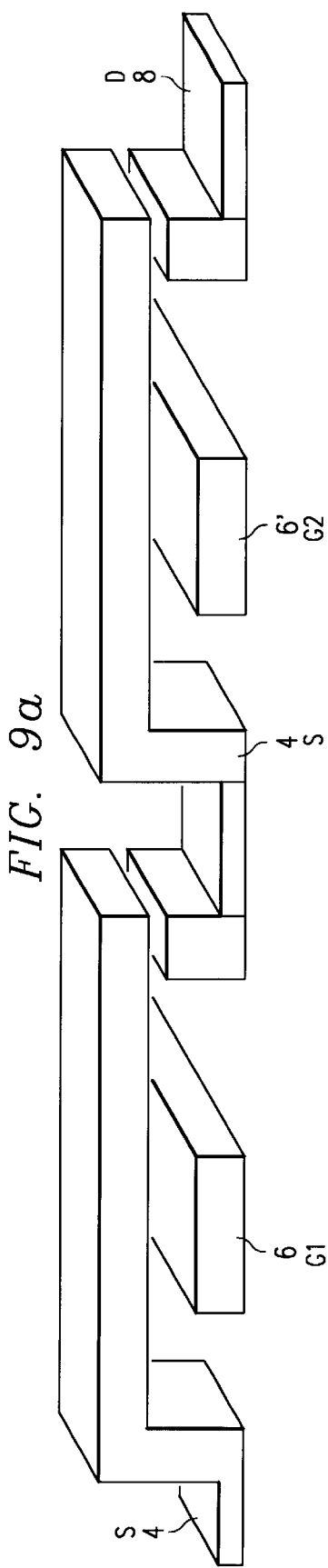
FIG. 9a
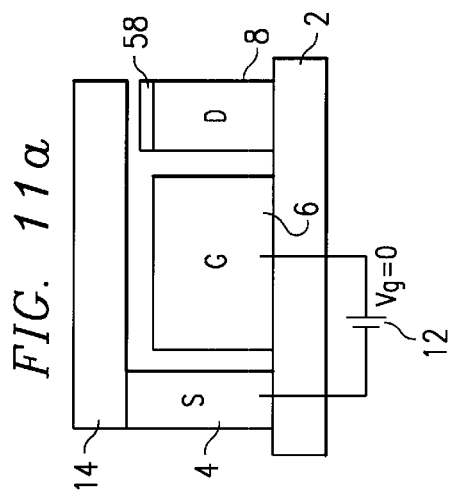
FIG. 11a
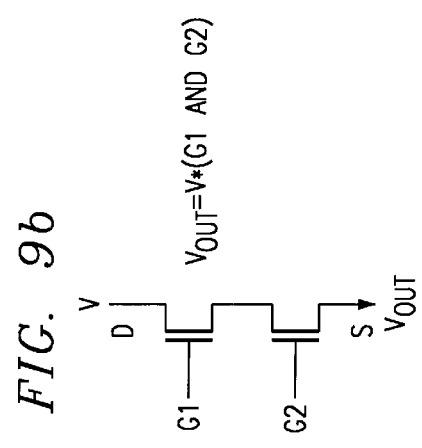
FIG. 9c
AND GATE
FIG. 9b

NANOMECHANICAL SWITCHES AND CIRCUITS

This patent is a divisional of U.S. patent application Ser. No. 09/711,001 filed Nov. 09, 2000.

FIELD OF THE INVENTION

This invention relates generally to submicron switching devices and more specifically to a nanomechanical switch using a deformable cantilever element.

BACKGROUND OF THE INVENTION

A significant factor in the electronic revolution has been the steady evolution of increasingly smaller integrated circuit geometries for the fabrication of semiconductor switching transistors. Typical feature sizes have been reduced from tens of microns in the early eighties, to roughly ten microns in the mid eighties, to below one micron in the mid nineties, until minimal lateral feature sizes of as small as 0.15 microns are not uncommon today. In addition to the obvious advantage of allowing for more transistors on a single chip, the smaller device geometries require less operating power and provide for faster switching speeds.

The preferred technology for state of the art submicron semiconductor devices is metal oxide silicon (MOS) transistors, which devices have historically allowed for ready scaling to smaller sizes as new submicron fabrication technologies are developed. MOS technology is approaching practical scaling limits, however, and it is projected that conventional MOS transistors cannot be scaled beyond 0.07 micrometers in their minimum feature size. These practical limitations include well known semiconductor phenomena, such as hot electron injection, gate oxide tunneling, short channel effects, and sub-threshold leakage that arise when the features of the transistor are too close together to allow proper turn-on and turn-off behavior.

It is also essential in military and space applications of digital electronics to prevent ambient nuclear or solar radiation from affecting the dynamic operation of switching devices. Switches based on semiconductor materials are vulnerable to such radiation effects, however.

Therefore, a need exists for a submicron switching device that does not consume excessive power, that has a fast switching response time, and that can be scaled beyond the current practical limitations for semiconductor switching transistors. The need also exists for a submicron switching device that is largely unaffected by high doses of particle, electromagnetic or other radiation.

SUMMARY OF THE INVENTION

In one aspect, the present invention provides a nanomechanical switch comprising a substrate and first, second and third electrodes formed on the substrate. The third electrode includes a cantilever member extending over the first and second electrodes. A voltage source is coupled between the first and third electrodes, wherein the cantilever member has an undeflected state when no bias is applied between the first and third electrodes, and a deflected state when a bias is applied between the first and third electrodes.

In other aspects, the invention provides for logical circuits formed of one or more such nanomechanical switches being connected together. In another aspect, the present invention provides for an integrated circuit comprising a substrate, a power conductor, a ground conductor, an input terminal and a logic circuit. The logic circuit comprises a plurality of nanomechanical switches, at least one nanomechanical switch being coupled to said power conductor, and at least one nanomechanical switch being coupled to said ground conductor. Each such nanomechanical switches comprise a first electrode, a second electrode, and a third electrode having a cantilever member extending substantially parallel to the substrate and extending over the first and second electrodes. The logic circuit further comprises a voltage source coupled between the first and second electrodes, wherein the cantilever member has an undeflected state when no bias is applied between the first and third electrodes, and a deflected state when a bias is applied between the first and second electrodes.

BRIEF DESCRIPTION OF THE DRAWINGS

The above features of the present invention will be more clearly understood from consideration of the following descriptions in connection with accompanying drawings in which:

FIGS. 2a through 2j illustrate a preferred embodiment process for manufacturing a nanomechanical switch 10;

FIGS. 3a through 3c illustrate a second preferred embodiment nanomechanical switch;

FIGS. 5a through 5c illustrate multiple nanomechanical switches comprising a common drain circuit;

FIGS. 9a through 9c illustrate a preferred embodiment circuit;

FIGS. 11a and 11b illustrate a fourth preferred embodiment nanomechanical switch;

DETAILED DESCRIPTION OF ILLUSTRATIVE EMBODIMENTS

The making and use of the various embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

Figure 1A:
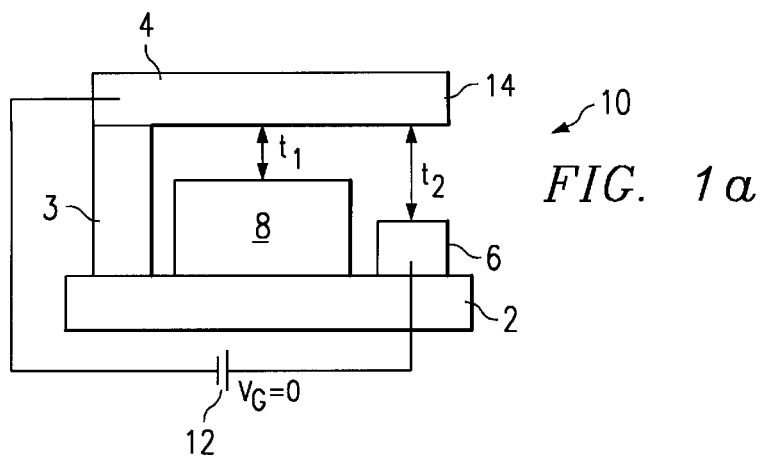
FIGS. 1a and 1b are a cross section of a first preferred embodiment switch in the open state and the closed state, respectively.
Figure 1B:
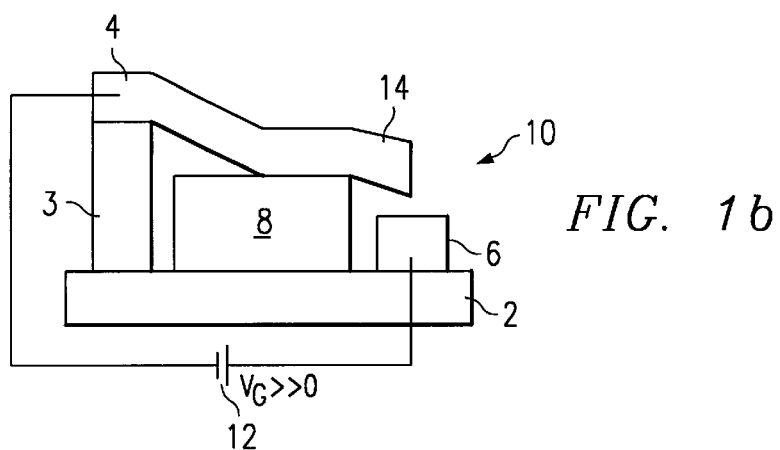

The present invention provides for a nanomechanical switch 10 as shown in FIGS. 1a and 1b. The switch is formed on substrate 2, preferably formed of a bulk semiconductor, but alternatively formed of any suitable non-conductive substrate such as glass, sapphire, ceramic, plastic, or the like. With a ceramic substrate, it would be particularly advantageous to use a glazed ceramic in order to obtain a smooth enough surface for further processing of the device features. Quartz would also make a good substrate because of its relatively low dielectric constant compared to material such as semiconductor, in order to prevent formation of unwanted capacitance with the substrate. In other embodiments, the switch may be formed on an insulating layer formed on the surface of substrate 2. In the case of the semiconductor substrate, a silicon dioxide layer could be formed prior to further processing.

Formed atop substrate 2 are metallic pads 6 and 8, referred to herein as the gate and drain, respectively. A source 4 is formed as an elongated metallic member 14 that is cantilevered over drain 8 and gate 6, and separated from them by thickness $t_1$ and $t_2$, respectively. Note that drain pad 8 is thicker (i.e. taller) than gate pad 6. This is to prevent cantilever 14 from contacting gate pad 6 when in its deflected state, as will be explained in further detail below.

In the first preferred embodiment, the dimensions for gate 6 and drain 8 are 0.1 microns by 0.1 microns. The dimension for drain 8 is preferably 0.05 microns by 0.1 microns. The dimensions for oxide feature 3, which acts as a hinge support, are preferably approximately the same as for drain 8. As will be apparent to one skilled in the art when taking the teachings contained herein into account, variations to the preferred embodiments can be made depending upon the design parameters to be achieved.

Formed atop and supported by oxide feature 3 is source 4, including cantilever 14 which extends substantially horizontally out from oxide feature 3 over drain pad 8 and gate pad 6. Note that cantilever 14 is spaced apart from the top of drain pad 8 when in its normal or undeflected state, by a switch gap, denoted as $t_1$. In the preferred embodiments, $t_1$ is about 20 to 40 angstroms in the open or undeflected state. Preferably $t_2$ should be about 10 to 20 angstroms greater than $t_1$, or about 30 to 50 angstroms. Although shown as projecting out horizontally, in alternative embodiments, cantilever may project out from source pad 4 at an angle to substrate 2 in order to, e.g. increase or decrease the normal state gap between cantilever 14 and drain pad 8. Also contemplated within the scope of the invention, is a nanomechanical switch that is formed normal to the plane of the substrate, such as may be formed on the sidewall of a deep trench in the substrate or a deep trench formed in a layer of material deposited on the substrate.

Also shown is voltage source 12 connected between source pad 4 and gate pad 6. In FIG. 1*a*, voltage source 12 is at 0 V. Source 4 and hence cantilever 14 are at zero bias with regard to gate pad 6. In FIG. 1*b*, however, voltage source 12 has been set to a positive value causing gate pad 6 to be positively biased with respect to source pad 4 and cantilever 14. This bias causes an electrostatic attraction between gate pad 6 and cantilever 14, thus pulling cantilever 14 downwards. As shown, because gate pad 6 is below the height of drain pad 8, cantilever 14 contacts drain pad 8 as a result of the attractive pull. In this way, an electrical circuit is completed between source pad 4 and drain pad 8. Note that the electrostatic attraction between gate pad 6 and cantilever 14 persists even when current flows from source 4 through cantilever 14 to drain 8. Note also that the electrostatic attraction is independent of the polarity of the voltage between source 4 and gate 6.

A brief discussion about the performance characteristics of the preferred embodiment switch is now provided. In the first preferred embodiment, cantilever 14 is constructed of aluminum and has a thickness of approximately 25 nm, a width of approximately 100 nm and a length of approximately 200 nm. Such a cantilever would have a volume of 5E-16 cc and a mass of about 1.35E-18 Kg. Assume the desired switching frequency is 2 GHz, then the switch response time must be 500 ps. This response time requires an approximate acceleration of the cantilever 14 at the rate $(2*t_1)/T^2$ where $t_1$ is the switch gap (the distance between cantilever 14 and drain pad 8), and T is the response time. For a switch gap of 4 nm, and a response time of 500 ps, the required acceleration would be 3.2E10 m/s$^2$. Under such acceleration, the velocity of cantilever 14 at the point it contacts drain pad 8 would be approximately $(2*t_1)/T$ or 16 m/s. Obviously, even faster switching times could be obtained, depending on the attractive force between cantilever 14 and gate pad 6, the mass of cantilever 14, the switch gap $t_1$, and the amount of voltage available to bias gate pad 6. For instance, the work that must be extended to move preferred embodiment cantilever 14 (mass*acceleration*distance) is 1.7E-16 Joules (1.35E-18 Kg*3.2E10 m/s$^2$*4 nm). This compares to the highest speed conventional semiconductor switches, which require switching energies in the range of tens of femtojoules. Assuming 2 watts of chip power were available, preferred embodiment cantilever 14 can be continuously switched at 2 GHz with an operating power of 1.7E-16*2E9=0.34 microwatts. This would allow 2/0.34E-6=6 million such switches to operate simultaneously with the 2 watt power budget.

Note that because of the inherent resiliency of cantilever 14, the switch will return to its open state (as shown in FIG. 1*a*) substantially as rapidly as the cantilever reaches its closed state. No biasing or voltage is required to open the switch; cantilever 14 will return to its undeflected state due to its spring constant once the gate voltage is removed.

The approximate required gate voltage for voltage source 12 can readily be determined from the formula $F=CV^2/t_2$ where F is the required force to operate the switch, V is the gate voltage, C is the gate capacitance, i.e. the capacitance between gate pad 6 and cantilever 14, and $t_2$ is the distance between gate pad 6 and cantilever 14. In the above described configuration, the gate capacitance C is about 1.8E-17 Farads (based on the dimensions of the cantilever and an underlying gate of roughly 100 nm by 100 nm), and the distance d is about 5 nm. A gate voltage of about 3.5 volts would be sufficient to fully deflect cantilever 14, assuming a cantilever vertical force (restoring force) constant of less than 16 Newtons per meter. Even lower gate voltage can be used if slower switching speeds are acceptable or if a lighter or less stiff cantilever is employed.

Disregarding contact resistance, the on-state resistance of the switch is about one ohm, which compares very favorably with the on-state resistance of about 92E3 ohms that would be expected for a 0.1 micrometer wide transistor using conventional MOS technology. With such a low resistance, the RC delay of the gate will be on the order of 2.2E-17 F*20E3 ohms=0.4 psec.

Figure 1C:
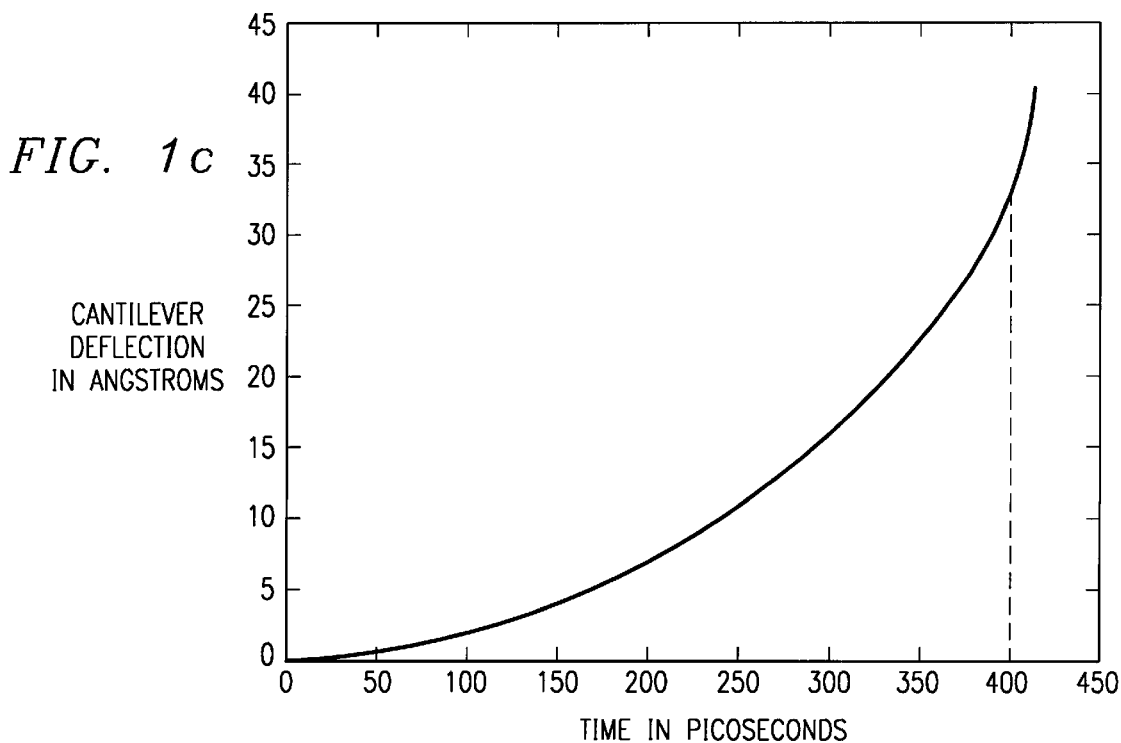
FIGS. 1c and 1d are plots of the response time of a first preferred embodiment nanomechanical switch.
Figure 1D:
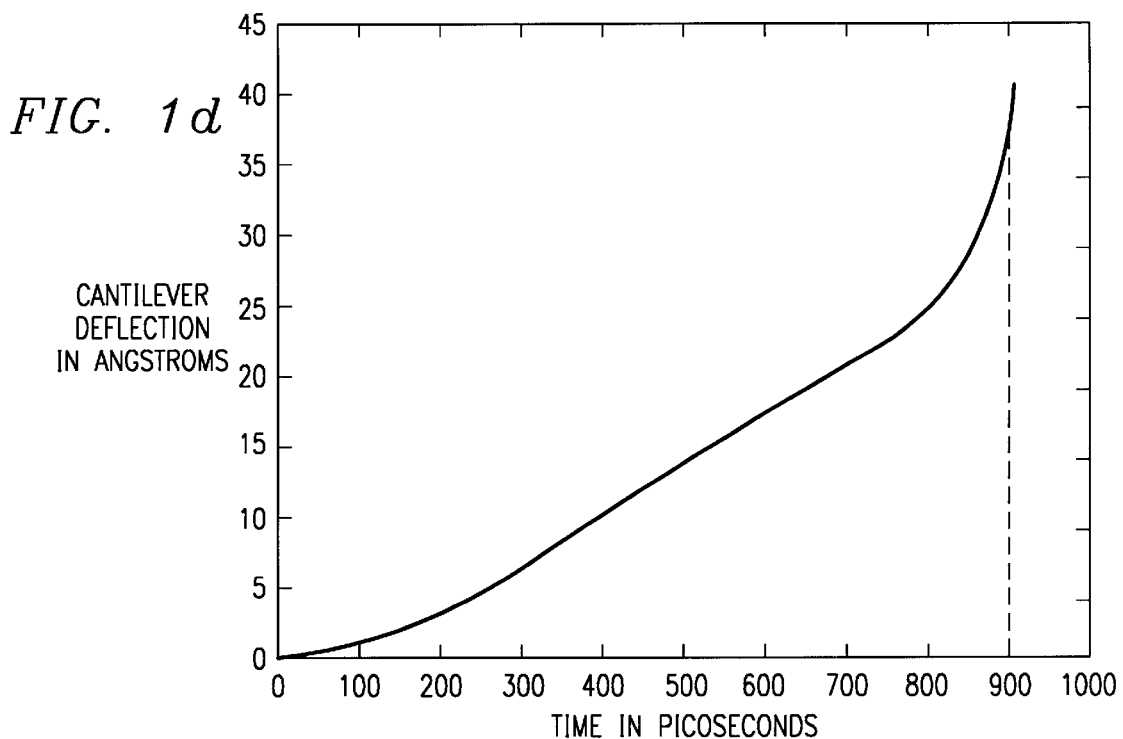

FIGS. 1*c* and 1*d* demonstrate the response time of switch 10 going from an open state (cantilever undeflected) to a closed state (cantilever deflected) for a 3 volt gate voltage and a 2 volt gate voltage, respectively. Note that the cantilever deflects the full 40 angstroms (i.e. closes the switch gap) in roughly 400 picoseconds in FIG. 1*c* when a 3 volt gate voltage is applied. The response time increases to about 900 picoseconds at the lower gate voltage of 2 volts, as shown in FIG. 1*d*.

Figure 2A:
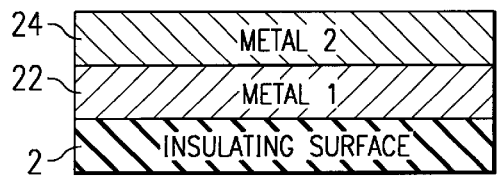

FIGS. 2*a* through 2*j* illustrate a preferred embodiment process for manufacturing a nanomechanical switch 10. In FIG. 2a, two metal layers 22 and 24 have been formed atop substrate 2. In the preferred embodiments, metal layer 22 is formed of platinum and metal layer 24 is formed of aluminum. Each layer is preferably 500 Angstroms thick and can be thermally deposited. Alternative deposition techniques such as sputtering, vapor deposition, and the like, as well as epitaxial growth of metal layers 22 and 24 are also contemplated.

Figure 2B:
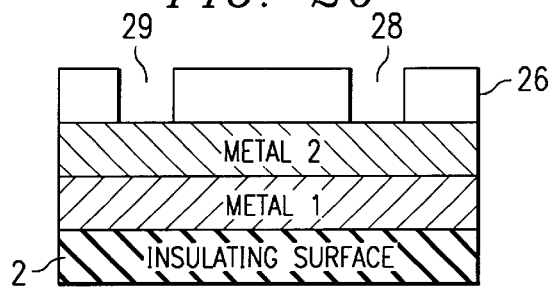
Figure 2C:
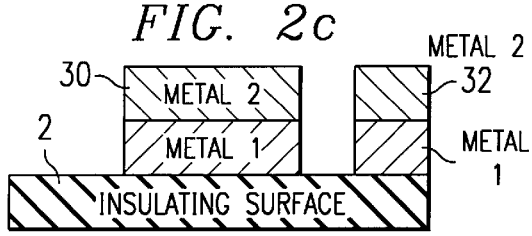

As shown in FIG. 2b, a photoresist layer 26 is patterned atop metal layer 24 with patters 28 and 29. Pattern 28 is formed in order to create an etch between islands 30 and 32 after an etch step has been applied, as shown in FIG. 2c. Pattern 29 in photoresist layer 26 is included in order to form island 30 symmetrically. In a separate process step, not shown, islands 30 and 32 are covered with a photoresist layer and the portion of metal layers 22 and 24 lying to the left of metallic island 30 is exposed to an etchant and etched away. The resulting structure is that illustrated in FIG. 2c. In an alternative embodiment, pattern 29 could be omitted and islands 30 and 32 formed without the intervening steps associated with pattern 29.

Figure 2D:
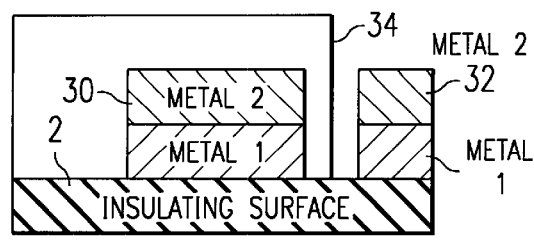

In a next process step, island 30 is covered with photoresist layer 36, as shown in FIG. 2d and island 32 is exposed to an etchant that selectively etches away metal layer 24, while leaving metal layer 22 intact, as shown in FIG. 2e. In the preferred embodiment structure, HCl or KOH etchants may be employed to selectively etch away the aluminum layer 24 without etching platinum layer 22. As illustrated in FIG. 2f, islands 30 and 32 are then covered with a deposited oxide layer 32, such as silicon dioxide, and oxide layer 32 is then subjected to a chemical mechanical polish step to form a smooth, planar surface 40, as shown in FIG. 2g. In other embodiments, a flowable oxide may be employed to form first oxide layer 38, which has the advantage of forming a relatively planar surface. Alternatively, plasma oxides could be employed. A second oxide layer 42 is then formed atop the planar surface 40, as shown in FIG. 2h. Second oxide layer 42 can be formed of the same material as first oxide layer 32, although this is not necessary. In the preferred embodiments, second oxide layer 42 is selected for providing good adhesion to metal layer 44 (FIG. 2i). For instance, if metal layer 44 is to be formed of aluminum, oxide layer 42 may be selected as aluminum oxide to provide good adhesion.

As will become apparent below, the thickness of second oxide layer 42 defines the switch gap $t_1$ In other embodiments, second oxide layer 42 could be eliminated if first oxide layer 38 could be grown or deposited with enough control and precision to form first oxide layer 38 with the desired thickness $t_1$ above island 30.

Metal layer 44 is then deposited atop second oxide layer 44 to form lo source 4, including cantilever 14. As will be apparent to one skilled in the art, source 4 and cantilever 14 can be formed through selective deposition of metal layer 44, or through subsequent mask and etching steps. Metal layer 44 is preferably aluminum or copper doped aluminum. The desired properties of metal layer 44 are low resistance, high resilience, and compatibility with metal layer 24 which forms the top surface of drain 8 (shown as island 30 in FIGS. 2c through 2k). Alternatively, metal layer 44 could be formed of platinum or some other refractory metal such as gold, nickel, paladium, tungsten or the like. Care should be taken in the selection of metal layer 24 and metal layer 44 that the selected metals do not tend to form alloys with each other and do not tend to stick together (from thermal bonding) as cantilever 14 (metal layer 44) comes into contact with drain 8 (metal layer 24). Another advantage of refractory metals is that very thin films can be formed, while still being a continuous film. In the preferred embodiments, metal layer 24 and metal layer 44 are formed of the same refractory metal, for the reasons discussed above. In other embodiments, other conductive materials, such as doped carbon or doped semiconductor, could be utilized in place of metal layers 22, 24, 44.

Also contemplated within the scope of the invention is laminated metal layers 22, 24, and 44, in which multiple sub-layers of different metals (such as platinum and aluminum) are sequentially deposited to form the metal layer. Laminated metal sub-layers tend to minimize warping and deformity of the layer, thus allowing tight tolerances in the switch gap $t_1$ and also in $t_2$. The smaller the switch gap $t_1$, the lower the operating voltage required to switch nanomechanical switch 10 from its open to closed state because of the higher field being generated across the gap.

In a subsequent process step, oxide layers 38 and 42 are subjected to an etchant such as $CF_4+O_2$ or other well known plasma etchants. The desired etchant will provide good lateral etching of the oxide layers in order to etch oxide layers 38 and 42 back beneath metal layer 44, leaving a gap between metal layer 44 and island 32, and between metal layer 44 and island 30, as shown in FIG. 2j. The resulting structure provides for gate 6 formed from island 32, drain 8 formed from island 30, and source 4 including cantilever 14 formed from metal layer 44. Although not shown for clarity, appropriate interconnects will also be provided in order to connect resulting switch 10 with other circuit components, including voltage source 12 between source 4 and drain 6.

Figure 3C:
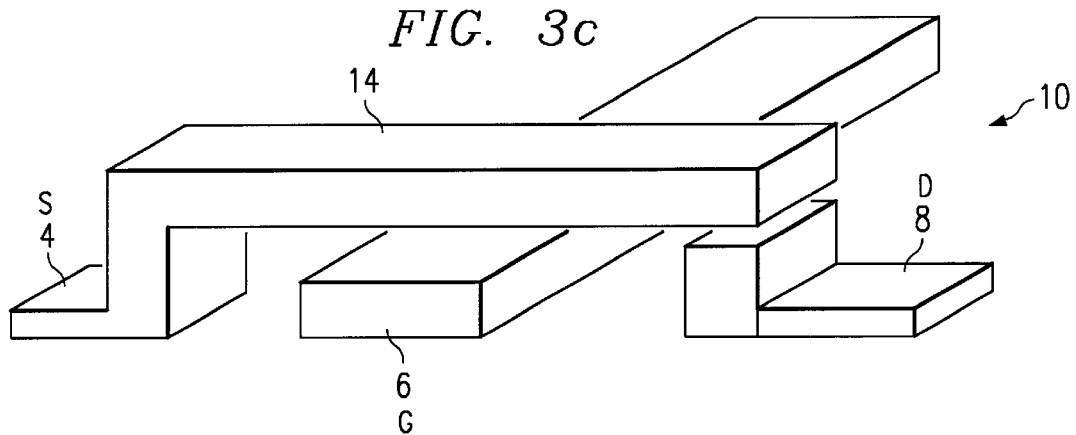

FIGS. 3a and 3b illustrate in cross section and FIG. 3c illustrates in perspective view, a second preferred embodiment nanomechanical switch 10, in the open and closed states, respectively. In the second preferred embodiment, source 4 is formed of a metallic island upon which is formed cantilever 14, and gate 6 is formed between source 4 and drain 8. As will be apparent to one skilled in the art, the processing required for forming the second preferred embodiment structure is similar to the first preferred embodiment structure, although three metallic islands would be formed, one each for the source 4, gate 6 and drain 8. Two advantageous features of the first preferred embodiment bear noting. First, by having the gate 6 spaced apart from the fulcrum for cantilever 14, greater torque can be obtained when gate 6 applies an electrostatic force on cantilever 14. Another advantage is that the larger gap between gate 6 and cantilever 14 may allow for more rapid and uniform etching of oxide layers 38 and 42, then would be provided with the smaller gap between drain 8 and cantilever 14 of FIGS. 3a and 3b.

Figure 4A:
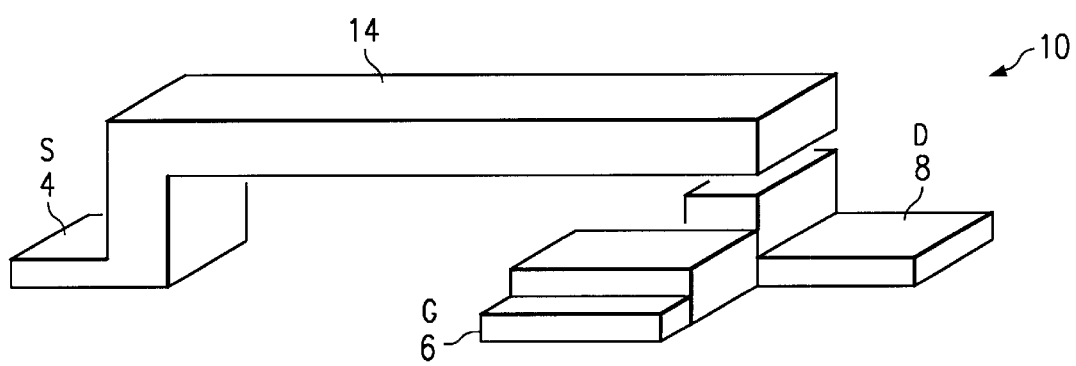
FIGS. 4a through 4d illustrate a third preferred embodiment nanomechanical switch.
Figure 4B:
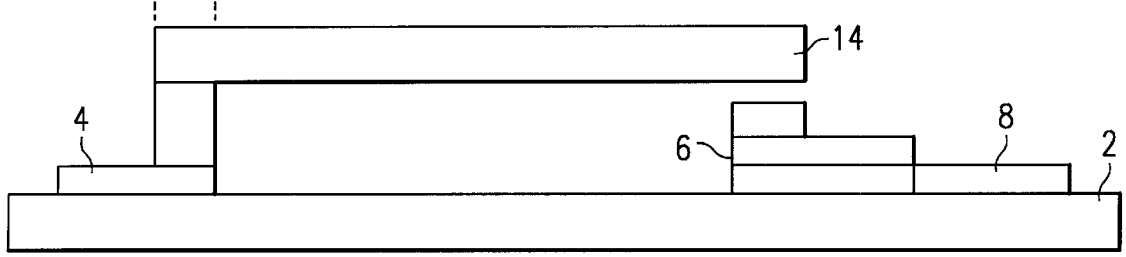
Figure 4C:
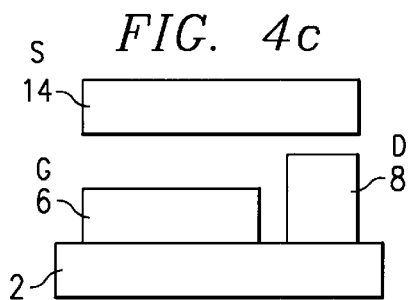
Figure 4D:
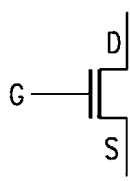
Figure 4E:
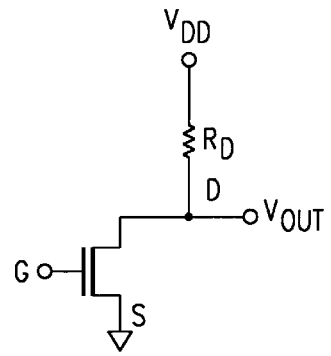

Various alternative embodiment switches and circuits will now be described with reference to FIGS. 4a through 9c. For instance, FIG. 4a illustrates in perspective view an alternate layout for nanomechanical switch 10 in which the gate 6 and drain 8 are both positioned under and near the free end of cantilever 14. FIG. 4b illustrates in elevation view from the side, and FIG. 4c illustrates in elevation view from the free end of the cantilever, the same switch 10. FIG. 4d provides a schematic representation of the device.

FIG. 5a provides a perspective view and FIG. 5b an elevation view of a common drain, two switch circuit 10 and 10', as illustrated schematically in FIG. 5c. The circuit has two sources 4 and 4', including two cantilevers 14 and 14', either of which will make electrical contact with common drain 8, under the control of gate 6 or 6', respectively. Only one source 4' and one gate 6' is illustrated in FIG. 5b, as the other source 4 and other gate 6 will be obscured when seen from the side. FIG. 5*c* illustrates the common drain circuit schematically.

Figure 6E:
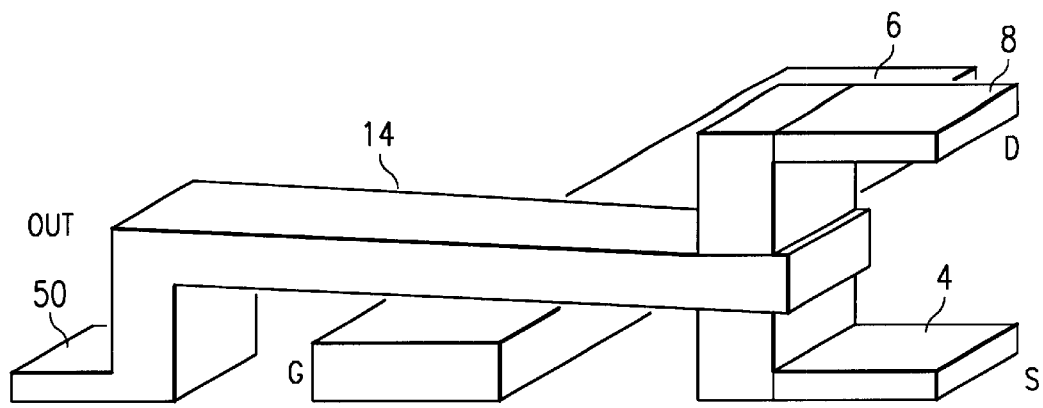
FIGS. 6a through 6g illustrate a preferred embodiment complementary pair nanomechanical switch circuit.
Figure 6F:
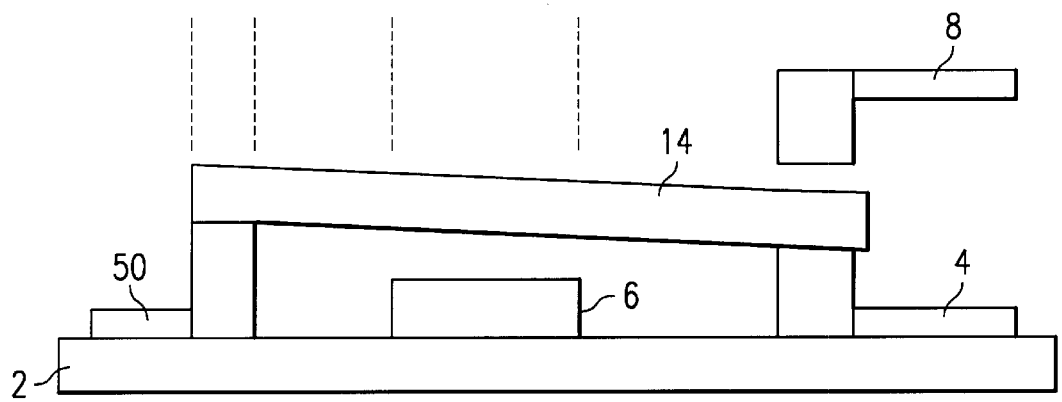
Figure 6G:
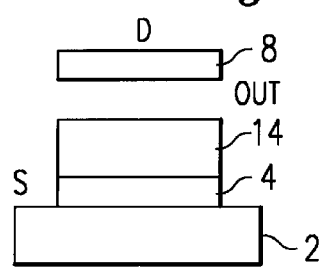
Figure 6H:
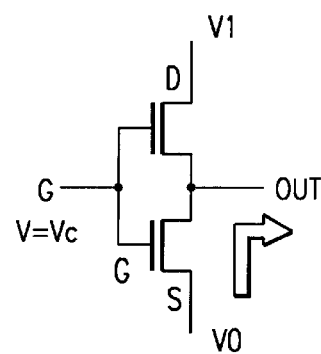

FIGS. 6*a* through 6*g* illustrate a nanomechanical switch configured to provide a CMOS type complementary response, as illustrated schematically in FIGS. 6*d* and 6*g*. In FIG. 6*a* the switch 10 is shown in perspective. Control gate 6 is shown underlying cantilever 14 but in this embodiment cantilever 14 is electrically coupled to output pad 50, rather than being formed from source pad 4. Instead source pad 4 is formed beneath the free end of cantilever 14 and drain 8 is formed overlying the free end of cantilever 14. FIGS. 6*b* and 6*c* illustrate the switch 10 of FIG. 6*a* in elevation view from the side and end-on view from the free end of cantilever 14, respectively. As shown, in the undeflected state (i.e. gate 6 being unbiased with respect to cantilever 14), cantilever 14 is held against drain 8 by the inherent spring tension of cantilever 14. Output pad 50 is thus connected to drain 8 and current will flow from drain 8 to output 50. As shown in FIGS. 6*e* and 6*f*, when a control voltage is applied to gate 6, an electrostatic attraction between gate 6 and cantilever 14 deflects cantilever 14 downward, breaking its electrical contact with drain 8 and bringing cantilever 14 into electrical contact with source 4. In this case current will flow from source 4 to source 50 (or in the other direction depending on the respective voltage levels on source 4 and output 50). In this way, output 50 can be electrically connected to either the drain 8 or the source 4. Setting drain voltage equal to a logical high and the source voltage equal to a logical low will result in a CMOS type circuit as is known in the art.

Figure 7A:
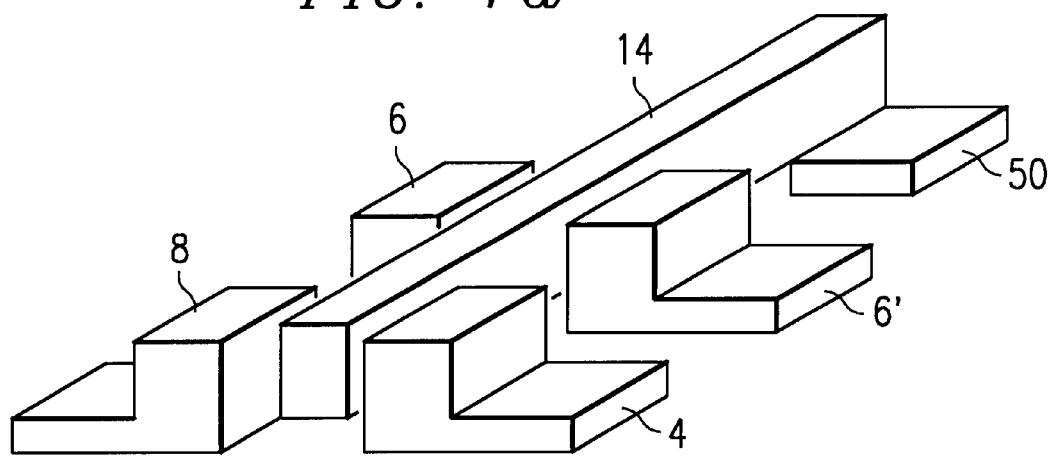
FIGS. 7a and 7b illustrate a second preferred embodiment complementary pair nanomechanical switch circuit.
Figure 7B:
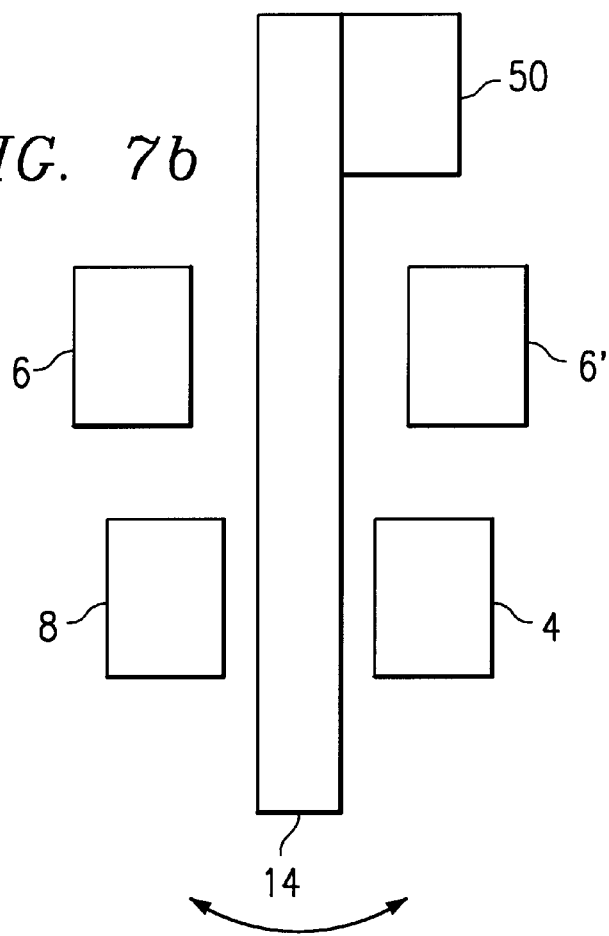

An alternative CMOS type circuit is illustrated in perspective in FIG. 7*a* and in plan view (i.e. top down view) in FIG. 7*b*. As illustrated, two gates 6 and 6' are positioned on either side of a laterally moving cantilever 14 which is connected to output 50. Note that unlike the previously discussed embodiments in which cantilever was deflected normally to the plane of substrate 2, in the embodiment shown in FIGS. 7*a* and 7*b*, cantilever 14 moves in a plane substantially parallel to the plane of substrate 2. In an undeflected state, i.e. when neither gate 6 nor gate 6' is biased with respect to cantilever 14, the cantilever will be positioned between gate 8 and source 4, but in electrical contact with neither. When a control voltage is applied to the first gate 6, cantilever will be deflected toward it and will come into electrical contact with drain 8, thus allowing current to flow between drain 8 and output 50. On the other hand, when a control voltage is applied to the second gate 6', cantilever 14 will be deflected toward source 4, thus electrically connecting source 4 and output 50 and disconnecting drain 8 and output 50. Note that, as best shown in FIG. 7*b*, the gates 6 and 6' are spaced further apart from cantilever 14 than are source 4 and drain 8 in order to ensure that cantilever 14 comes into electrical contact with source 4 and drain 8 and does not short out against or come into electrical contact with gates 6 and 6' . An advantage provided by this embodiment is that the output 50 can be put in a high impedance state, i.e. when neither gate 6 nor gate 6' is biased with respect to cantilever 14, or when both gates 6 and 6' are essentially equally biased with respect to cantilever 14.

Figure 8A:
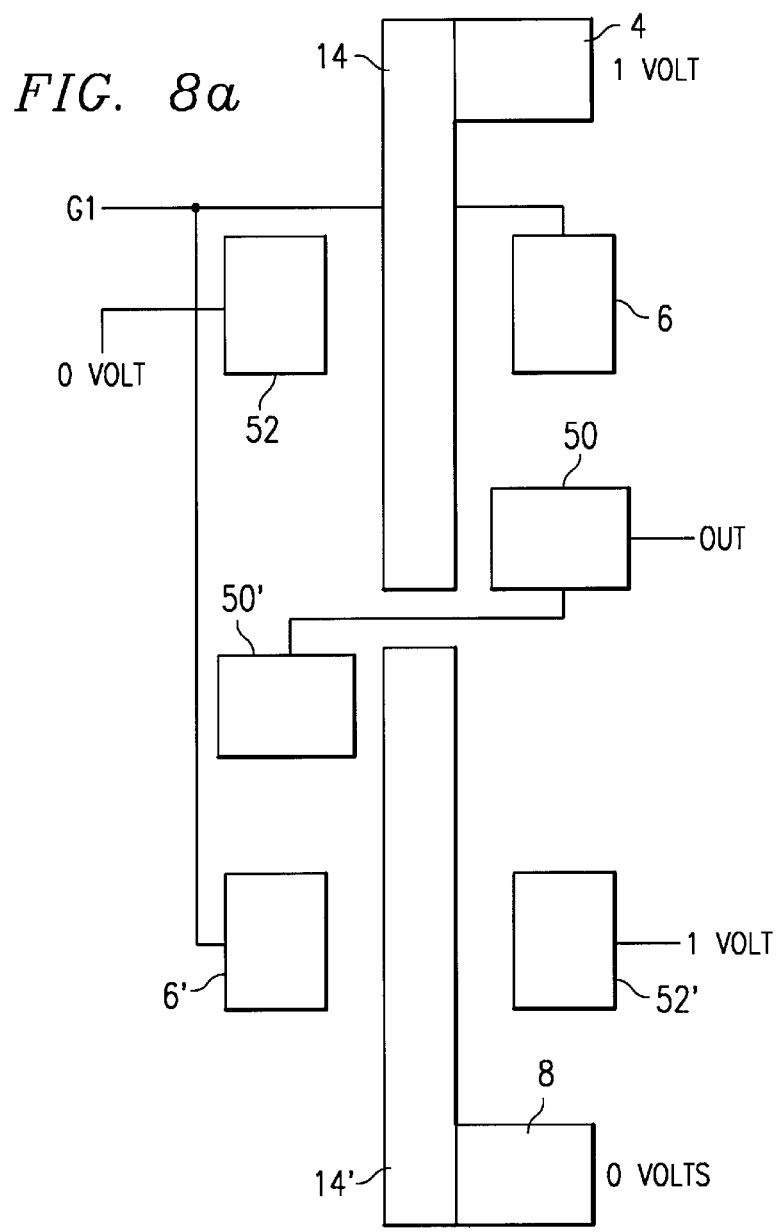
FIGS. 8a and 8b illustrate a preferred embodiment complementary inverter.
Figure 8B:
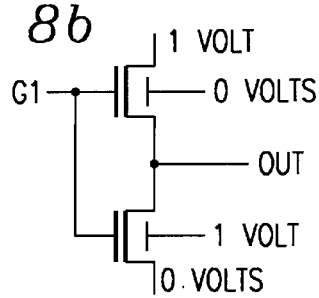

Yet another device is illustrated in FIGS. 8*a* (plan view) and 8*b* (schematically), where two cantilevers 14 and 14' are employed to form a complementary inverter. A single gate control voltage is tied to two gates 6 and 6' associated with cantilevers 14 and 14' respectively. The illustrated circuit will provide an inverted signal in response to an input signal G1 being applied to gates 6 and 6'. As shown, each cantilever has a fixed voltage source placed opposite its respective gate. Fixed voltage source 52 is adjacent cantilever 14 opposite from gate 6 and is tied to a 0V. Fixed voltage source 52' is adjacent cantilever 14' opposite from gate 6' and is tied to 1V. Note that voltage sources 52 and 52' are spaced further from cantilevers 14 and 14', respectively, than are gates 6 and 6', respectively. Assume a zero volt (or logical low) gate voltage G1 is input to the circuit. Gate 6 will electrostatically attract cantilever 14, which is held at a one volt via source 4 and will deflect cantilever 14 to contact output pad 50. Cantilever 14', being held to a zero volt level will not be attracted to gate 6' when it is at a logical low. On the other hand, when gate voltage G1 is set to a logical high voltage, cantilever 14' will be attracted and deflected toward gate 61, thus connecting output 50' to drain 8 at zero volts. At the same time, cantilever 14, being held at a logical high level by source 4, will no longer be deflected sufficiently to contact gate 6. FIG. 8*b* schematically illustrates the circuit.

Yet another device is illustrated in FIGS. 9*a* through 9*c*. In this embodiment, a logical AND function is achieved through serially ganging two nanomechanical switches 10, as shown in perspective in FIG. 9*a*. In this embodiment, the drain of the first switch is connected to the source of the second switch. The first source 4 is deflected to contact common source/drain 54 when first gate 6 is high (i.e. biased with respect to cantilever 14 of first source 4). Common source/drain 54 is controlled by second gate 6' and connects to drain 8 when gate 6' is high. A logical input at drain 8 will be coupled to source 4 only when both gates 6 and 6' are high. FIG. 9*b* schematically illustrates the circuit of FIG. 9*a*, and FIG. 9*c* provides a truth table for the circuit showing its logical AND function.

In many applications, the gate to source voltages that are used to operate the cantilever will be of the same magnitude as those applied between the source and drain. It is necessary to arrange the dimensions of is the gate and drain such that the electrostatic force of the gate to the cantilever is sufficiently greater than the force between the drain and cantilever so as to prevent the cantilever from being deflected simply by the voltage applied between the source and drain pads. Likewise, the restoring force of the cantilever must be sufficiently greater than the electrostatic force between the drain and the cantilever when the cantilever is deflected onto the drain so as to prevent the cantilever from remaining in the deflected state when the gate voltage is removed.

The electrostatic force between two roughly parallel metals is approximately $CV^2/d$ where C is the capacitance between the metals, V is the potential difference between the metals, and d is the separation between them. Since in many applications, V and d will be similar for the gate and drain voltages and for the cantilever separations, one way to ensure that the drain to cantilever force is substantially less than the gate to cantilever force is to ensure that the capacitance between the gate and the cantilever is substantially greater than the drain to cantilever capacitance. This is preferably accomplished by making the gate pad (electrode) much larger in surface area than the drain pad. It is also noted that locating the drain pad between the cantilever hinge and the gate pad also reduces the effect of the drain voltage relative to the gate due to the greater leverage of the gate force on the cantilever relative to the drain force.

In the above described embodiments, it has been assumed that physical contact between the cantilever and the drain was required in order to generate source to drain current. As will be described in the following paragraphs, actual contact is not required because the device can take advantage of electron tunneling. Electron tunneling is a quantum phenomenon in which an electron will cross an insulating barrier, such as a vacuum gap or air gap, provided the barrier is sufficiently thin compared to the quantum or DeBroglie wave length of the electron in the barrier material.

Figure 10:
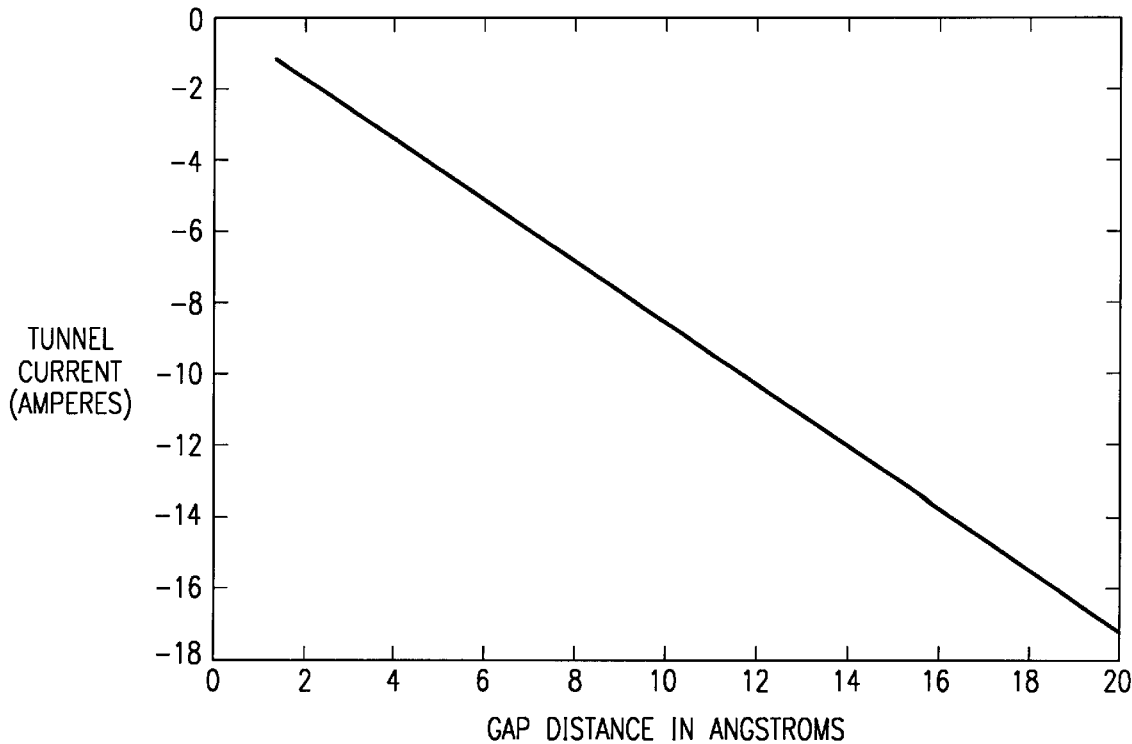
FIG. 10 is a graph plotting tunneling current as a function of tunneling distance for preferred embodiment nanomechanical devices.

Referring now to FIG. 10 in conjunction with FIG. 3a, a graph shows the relationship between the tunneling current between cantilever 14 and drain 8 as a function of the distance between the cantilever and the drain. The tunneling current is a function of the surface area between the electrodes, the work function of the electrodes, the voltage between the cantilever and drain, and the distance between them. Assume the dimensions of drain pad 8 are 500 angstroms by 1000 angstroms the switch gap $t_1$ varies from 20 angstroms in the undeflected state to 5 angstroms in the deflected state, and that the cantilever to drain voltage is 2 volts. For the preferred embodiment switch in which the gap material is vacuum, the work function for aluminum electrodes is 4 volts. The relationship between tunneling current and switch gap $t_1$ is shown in FIG. 10. In the undeflected state, (i.e. $t_1$ at 20 angstroms) the tunneling current between cantilever 14 and drain 8 would be on the order of 10E-18 amps effectively an open circuit. In fact, this amount of off state tunneling current is much less than the off state leakage current associated with current MOS transistors by many orders of magnitude. Note also that an undesired tunneling current may also occur between cantilever 14 and gate 6. The distance between cantilever 14 and gate 6 is preferably 40 angstroms, however. By extrapolating the plot of FIG. 10, it will be clear that the tunneling current crossing the 40 angstrom gap will be essentially non-existent.

By contrast, when the cantilever is brought close to drain 8 (say 5 angstroms), in response to control gate 6, the tunneling current increases exponentially to approximately 1 microamp—clearly sufficient on-state current for typical logic circuits, even though cantilever 14 and drain 8 are not in contact.

Figure 11B:
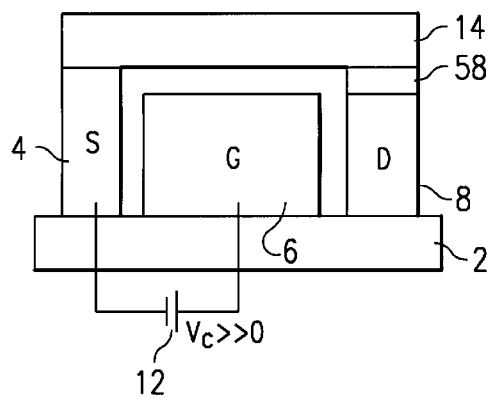

FIGS. 11a and 11b illustrate a preferred embodiment switch which takes advantage,of the tunneling effect to allow for a lubricating layer between cantilever 14 and drain 8 in order to minimize the risks of mechanical failure, alloy formation, thermal bonding, and the like arising from metal to metal contact. FIGS. 11a and 11b are essentially the same as FIGS. 3a and 3b, but with the addition of lubricating layer 58 formed on the top surface of drain 8. Lubricating layer 58 is preferably an oxide or polymer insulating layer that of approximately 5 angstroms thickness. This layer provides a buffer between cantilever 14 and drain 8 when the cantilever is in its deflected state. Even though layer 58 is an insulating layer, as discussed above, the switch, when cantilever 14 is deflected, will be in an on state because of the tunneling current flowing across the 5 angstrom layer. In fact, because the work function for an oxide or polymer is less than that for vacuum, more tunneling current will flow across layer 58 than would flow across a vacuum gap of similar thickness. Thus many different insulators or conductors could be selected for the lubricating layer 58 without reducing the performance relative to a vacuum insulator. Any of the above described embodiments will also exhibit the desired tunneling phenomenon with appropriately chosen materials and dimensions.

Figure 12A:
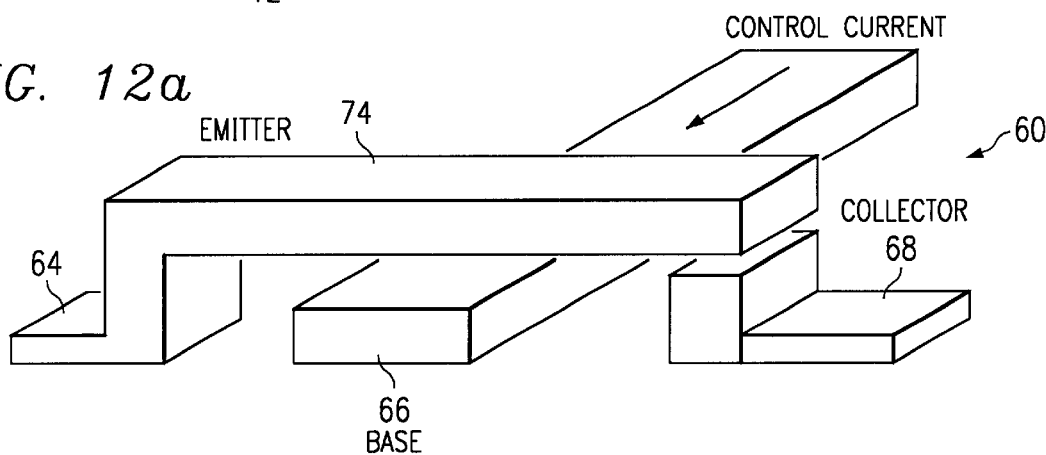
FIGS. 12a and 12b illustrate a fifth preferred embodiment nanomechanical switch.
Figure 12B:
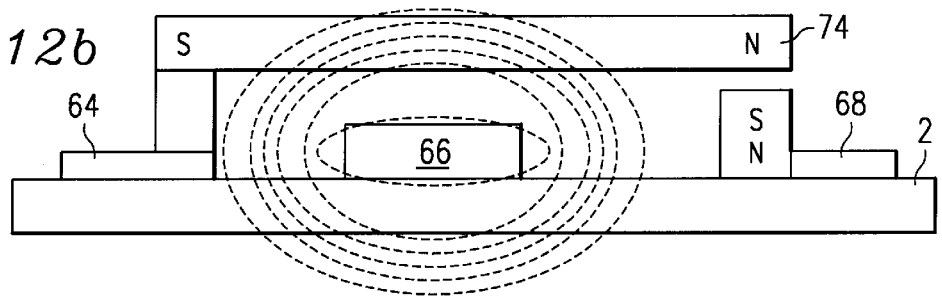

The above embodiments have been essentially "MOS analogs" in which the controlling signal is a gate voltage. A "bipolar analog" embodiment controlled by current will now be described with reference to FIGS. 12a and 12b. As shown in FIG. 12a, switch 60 comprises an emitter 64 electrode including a cantilever 74, and a base electrode 66 and collector electrode 68. Current flowing through base electrode 66 creates a magnetic field surrounding the electrode, as shown in FIG. 12b. This magnetic field induces a magnetic field in emitter electrode 64, and in particular cantilever 74 and also in collector electrode 68. The induced magnetic fields in cantilever 74 and collector 68 are oriented with the polarity of the field created by current in base electrode 66. As illustrated, the induced magnetic north pole in cantilever 74 will be complementary to the induced magnetic south pole in collector electrode 68, thus resulting in a magnetic attraction that will cause cantilever 74 to deflect toward collector 68. It should be noted that the magnetic field emanating from base electrode 66 decreases roughly with the distance r from the electrode (1/r). The distance between base electrode 66 and cantilever 14 must be fairly small therefore, in order to sufficient a magnetic field to be induced in cantilever 14 and collector 68 to overcome the natural resiliency of cantilever 14.

In the preferred embodiment magnetic switches, both cantilever 74 and collector 68 should be formed of material with magnetic permeability much greater than one, such as ferro-magnetic or para-magnetic materials, so as to have a strong magnetic field induced within them. Examples would include iron, nickel, cobalt, paladium, conductive alloys of these materials, and the like. Note that the use of multi-layer materials may be particularly advantageous for obtaining both desirable conductivity and magnetic permeability in the cantilever, and the collector and emitter. Preferably the multi-layer material would provide for a high conductivity surface layer, such as gold, covering a bulk material with a high magnetic permeability, such as nickel.

An advantageous feature of the magnetic embodiments is that the magnetic attraction is a function of the current in base electrode 66, as opposed to being a function of voltage. Therefore, magnetically activated transistors can be built with very low operating voltages. Base electrode 66 is preferably made of gold or other material with very low resistivity in order to minimize the voltage required to generate base current. Alternatively, by constructing base electrode 66 out of a superconducting material, no energy would be consumed by the device in the steady state, because no voltage would be required to maintain base current.

Many variations to the described embodiments will be apparent to one skilled in the art with the benefit of the teachings contained herein. For instance, the various switches and circuits described herein can be combined to form logical circuits and devices. The switches and circuits described herein can be fabricated using known semiconductor processing techniques, and can hence be formed on a common substrate with classical CMOS or NMOS switches and circuits. Whereas the embodiments have been described with respect to a vacuum gap, Argon or some other noble gas could also be employed. An air ambient could also be employed if care is taken minimize effects such as corrosion.

Figure 13:
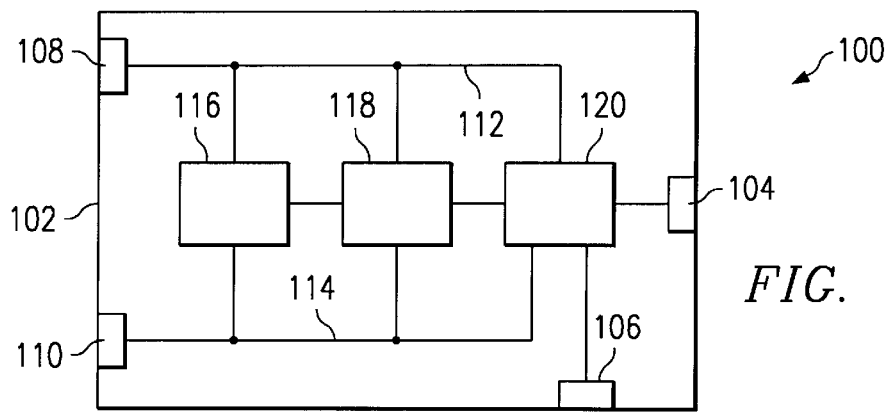
FIG. 13 illustrates a preferred embodiment integrated circuit comprised at least in part of nanomechanical switches.

FIG. 13 illustrates an integrated circuit 100 embodying aspects of the invention. The integrated circuit includes a substrate 102 upon which is formed various circuit components. Signals can be supplied to and received from integrated circuit 100 by way of input/output ports 106. Power is supplied to integrated circuit 100 by way of power port 108 and ground port 110, to which are coupled power conductor 112 and ground conductor 114, respectively for supplying power to circuit components. Included in the circuit components is nanomechanical logic circuit 116, Nanomechanical logic circuit 116 is formed of a series of interconnected nanomechanical switches as described above. Also shown in FIG. 13 is memory array 118, preferably also formed of nanomechanical switches configured as memory cells. Preferably, all circuits formed on integrated circuit 100 are fabricated using nanomechanical transistors in order to provide the benefits of speed, size, power savings, and radiation survivability discussed above. In some embodiments, however, semiconductor logic 120 could also be formed on substrate 102 using well known MOS, CMOS or bipolar semiconductor processes.

Various other modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A nanomechanical switch comprising:

a substrate;

formed on the substrate, an emitter electrode including a cantilever element extending from the emitter electrode, the emitter being formed of a material having a magnetic permeability greater than one;

a base electrode formed on the substrate, at least a portion of the base electrode being beneath the cantilever element;

a collector electrode formed on the substrate adjacent the base electrode, at least a portion of the collector electrode being beneath the cantilever element and being formed of a material having a magnetic permeability greater than one; and a current source coupled to the base electrode.

2. The nanomechanical switch of claim 1 wherein current flowing in the base electrode induces complementary magnetic fields within the cantilever and the collector electrode.

3. The nanomechanical switch of claim 1 wherein the cantilever is spaced apart from the base electrode by less than 40 angstroms when in an undeflected state.

4. The nanomechanical switch of claim 1 wherein the collector electrode is higher, relative the plane of the substrate, than the base electrode.

5. The nanomechanical switch of claim 1 further comprising a lubricating layer formed atop the collector electrode.

6. The nanomechanical switch of claim 1 further comprising interconnection conductors connecting the switch with other circuit elements.

7. The nanomechanical switch of claim 1 wherein a vacuum gap is formed between the cantilever and the collector electrode.

8. The nanomechanical switch of claim 1 wherein a noble gas is placed between the cantilever and the collector electrode.

9. The nanomechanical switch of claim 1 wherein the spacing between the base and collector electrodes is less than 0.07 micrometers.

10. The nanomechanical switch of claim 7 wherein the base collector is formed of a superconducting material.

* * * * *